United States Patent
Glosser, Jr. et al.

(10) Patent No.: US 7,642,748 B2
(45) Date of Patent: Jan. 5, 2010

(54) BATTERY CHARGING SYSTEM AND METHOD OF OPERATING SAME

(75) Inventors: Richard Joseph Glosser, Jr., Martinez, GA (US); William John Bonneau, East Troy, WI (US); Brian Nedward Meyer, Fairview, PA (US)

(73) Assignee: General Electric Company, Schenectady, NY (US)

( * ) Notice: Subject to any disclaimer, the term of this patent is extended or adjusted under 35 U.S.C. 154(b) by 123 days.

(21) Appl. No.: 11/253,933

(22) Filed: Oct. 19, 2005

(65) Prior Publication Data

US 2007/0090797 A1    Apr. 26, 2007

(51) Int. Cl.
  *H02J 7/00*    (2006.01)
(52) U.S. Cl. ...................................... 320/116
(58) Field of Classification Search ................ 320/116, 320/117, 118, 119, 122, 134, 138, 121
  See application file for complete search history.

(56) References Cited

U.S. PATENT DOCUMENTS

| | | | |
|---|---|---|---|
| 4,006,397 A | | 2/1977 | Catotti et al. |
| 4,016,474 A | | 4/1977 | Mason |
| 4,052,656 A | | 10/1977 | Lavell et al. |
| 4,081,738 A | * | 3/1978 | Roller ......................... 320/117 |
| 4,645,995 A | | 2/1987 | Terrell et al. |
| 5,057,762 A | * | 10/1991 | Goedken et al. ............. 320/116 |
| 5,164,761 A | * | 11/1992 | Isono et al. .................. 396/279 |
| 5,504,415 A | * | 4/1996 | Podrazhansky et al. ...... 320/118 |
| 5,523,668 A | | 6/1996 | Feldstein |
| 5,617,004 A | | 4/1997 | Kaneko |
| 5,629,601 A | | 5/1997 | Feldstein |
| 5,659,237 A | | 8/1997 | Divan et al. |
| 5,701,068 A | | 12/1997 | Baer et al. |
| 5,920,179 A | * | 7/1999 | Pedicini ....................... 320/122 |
| 6,014,013 A | * | 1/2000 | Suppanz et al. .............. 320/122 |
| 6,414,465 B1 | * | 7/2002 | Banks et al. ................. 320/118 |
| 6,452,363 B1 | | 9/2002 | Jabaji |
| 6,462,511 B1 | * | 10/2002 | Kwok .......................... 320/119 |
| 6,489,753 B1 | | 12/2002 | Patterson |
| 6,609,889 B1 | * | 8/2003 | Vilsboll .......................... 416/1 |
| 6,630,812 B1 | * | 10/2003 | Davis ........................... 320/116 |
| 6,664,762 B2 | | 12/2003 | Kutkut |

(Continued)

FOREIGN PATENT DOCUMENTS

DE    202005010542 U1    5/2007

(Continued)

OTHER PUBLICATIONS

EP Search Report; Dated Feb. 16, 2007; Reference No. 156744/11840; Application No./Patent No. 06255329.2-2207; Place of Search—Munich; 7 pgs.

*Primary Examiner*—Edward Tso
*Assistant Examiner*—M'Baye Diao
(74) *Attorney, Agent, or Firm*—Armstrong Teasdale LLP

(57) ABSTRACT

A method for charging a plurality of batteries wherein each battery includes an anode and a cathode. The method includes electrically coupling n batteries to form a string of batteries, electrically coupling n battery charger assemblies to the n batteries such that each respective battery charger assembly is coupled to an anode and a cathode of a respective battery, and charging the plurality of batteries utilizing the n battery charger assemblies.

20 Claims, 5 Drawing Sheets

U.S. PATENT DOCUMENTS

| | | |
|---|---|---|
| 6,841,971 B1 | 1/2005 | Spee et al. |
| 2001/0020838 A1* | 9/2001 | Malackowski ............... 320/116 |
| 2003/0236601 A1 | 12/2003 | McLeod et al. |
| 2004/0012371 A1* | 1/2004 | Ott et al. ..................... 320/116 |
| 2004/0189248 A1* | 9/2004 | Boskovitch et al. ......... 320/116 |
| 2004/0263119 A1* | 12/2004 | Meyer et al. ................ 320/116 |
| 2005/0242775 A1* | 11/2005 | Miyazaki et al. ............ 320/116 |
| 2006/0163882 A1 | 7/2006 | Brandt |

FOREIGN PATENT DOCUMENTS

WO             2005017350 A1     2/2005

* cited by examiner

BATTERY CHARGING SYSTEM AND METHOD OF OPERATING SAME

BACKGROUND OF THE INVENTION

This invention relates generally to charging batteries, and more specifically to methods and systems for charging batteries and extending battery life.

At least some known batteries are electrically coupled in a series or parallel string configuration to facilitate increasing the voltage that is available to the system in which the batteries are connected. To facilitate charging such strings of batteries, at least one known system utilizes a typically constant voltage source charger. However, overcharging a lead acid battery may damage the battery and/or reduce the effective operational life of the battery, whereas undercharging a battery reduces the time the battery can be utilized in the system. Moreover, while coupling a single known charging system to a plurality of batteries that are coupled together in either a series or parallel configuration facilitates balancing the charging power equally across the string of batteries, the charging system does not effectively charge each individual battery in the string of batteries. Therefore, at least some batteries in the string of batteries, or at least some cells within an individual battery in the string of batteries, may be overcharged, while other batteries or cells within an individual battery are undercharged.

BRIEF SUMMARY OF THE INVENTION

In one aspect, a method for charging a plurality of batteries is provided. The method includes electrically coupling n batteries to form a string of batteries, electrically coupling n battery charger assemblies to the n batteries such that each respective battery charger assembly is coupled to an anode and a cathode of a respective battery, and charging the plurality of batteries utilizing the n battery charger assemblies.

In another aspect, a battery charging system is provided. The battery charging system includes a first battery charger assembly coupled in parallel with a first battery, and a second battery charger assembly coupled in parallel with a second battery, the first and second batteries electrically coupled to form a string of batteries.

In a further aspect, a wind turbine is provided. The wind turbine includes a rotor having at least one blade operatively coupled to at least one pitch motor and a battery charging system. The battery charging system includes a first battery charger assembly coupled in parallel with a first battery, and a second battery charger assembly coupled in parallel with a second battery, the first and second batteries electrically coupled to form a string of batteries that are coupled to the pitch motor.

DETAILED DESCRIPTION OF THE INVENTION

Figure 1:
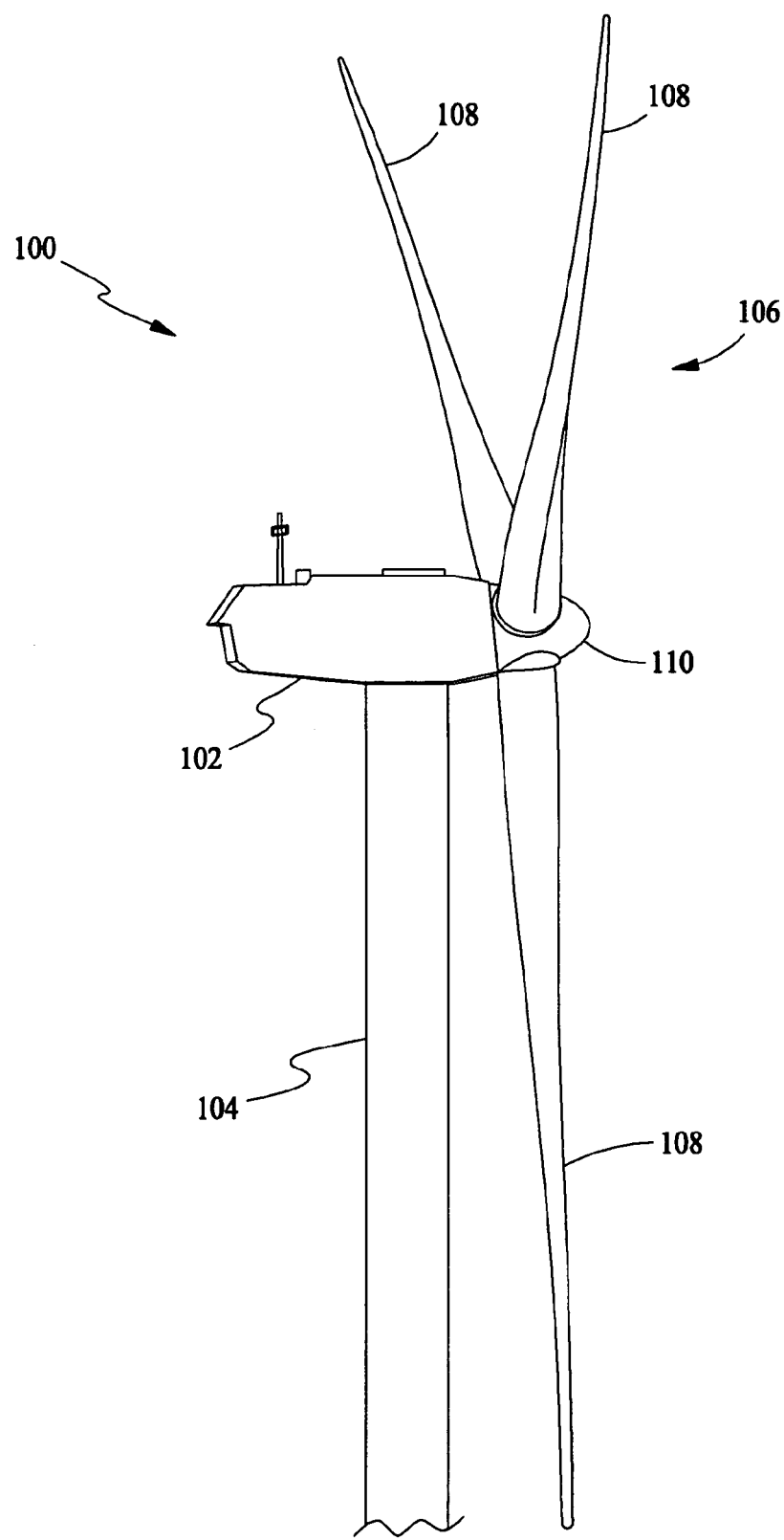
FIG. 1 is a perspective view of an exemplary wind turbine.

FIG. 1 is a perspective view of an exemplary wind turbine 100 that includes a nacelle 102 housing a generator (not shown in FIG. 1). Nacelle 102 is mounted atop a tall tower 104, only a portion of which is shown in FIG. 1. Wind turbine 100 also includes a rotor assembly 106 that includes a plurality of rotor blades 108 attached to a rotating hub 110. Although wind turbine 100 illustrated in FIG. 1 includes three rotor blades 108, there are no specific limits on the number of rotor blades 108 required by the present invention.

Figure 2:
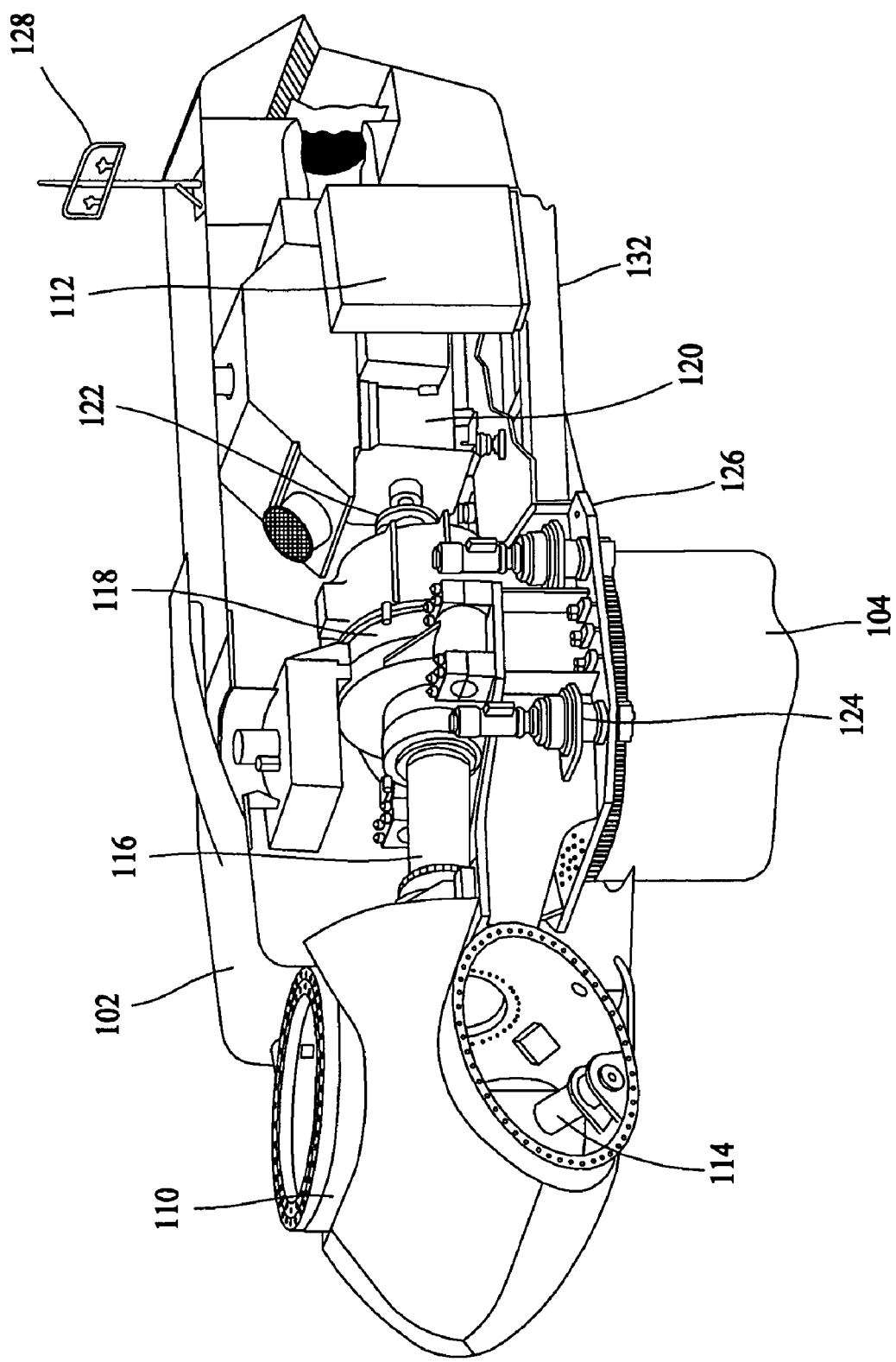
FIG. 2 is a perspective view of a portion of the exemplary wind turbine shown in FIG. 1.

In some configurations and referring to FIG. 2, various components are housed in nacelle 102 atop tower 104 of wind turbine 100. The height of tower 104 is selected based upon factors and conditions known in the art. In the exemplary embodiment, wind turbine 100 includes a control system 112 that is configured to perform overall system monitoring and control including pitch and speed regulation, high-speed shaft and yaw brake application, yaw and pump motor application and fault monitoring.

In the exemplary embodiment, control system 112 provides control signals to a variable blade pitch drive system 114 (which includes at least of an AC or a DC pitch drive motor, not shown in FIG. 2) to control the pitch of blades 108 (also not shown in FIG. 2) that drive hub 110 as a result of wind. In the exemplary embodiment, hub 110 receives three blades 108. In an alternative embodiment, hub 110 is configured to receive any number of blades. In the exemplary embodiment, the pitches of blades 108 are individually controlled by blade pitch drive system 114.

The drive train of the wind turbine includes a main rotor shaft 116 (also referred to as a "low speed shaft") connected to hub 110 and a gear box 118 that, in some configurations, utilizes a dual path geometry to drive a high speed shaft enclosed within gear box 118. The high speed shaft (not shown in FIG. 2) is used to drive a first generator 120 that is supported by a main frame 132. In some configurations, rotor torque is transmitted via coupling 122. First generator 120 may be of any suitable type, for example and without limitation, a wound rotor induction generator. Another suitable type by way of non-limiting example is a multi-pole generator that can run at the speed of the low speed shaft in a direct drive configuration, without requiring a gearbox.

Yaw drive 124 and yaw deck 126 provide a yaw orientation system for wind turbine 100. In some configurations, the yaw orientation system is electrically operated and controlled by control system 112 in accordance with information received from sensors used to measure shaft flange displacement, as described below. Either alternately or in addition to the flange displacement measuring sensors, some configurations utilize a wind vane 128 to provide information for the yaw orientation system. The yaw system is mounted on a flange provided atop tower 104.

Figure 3:
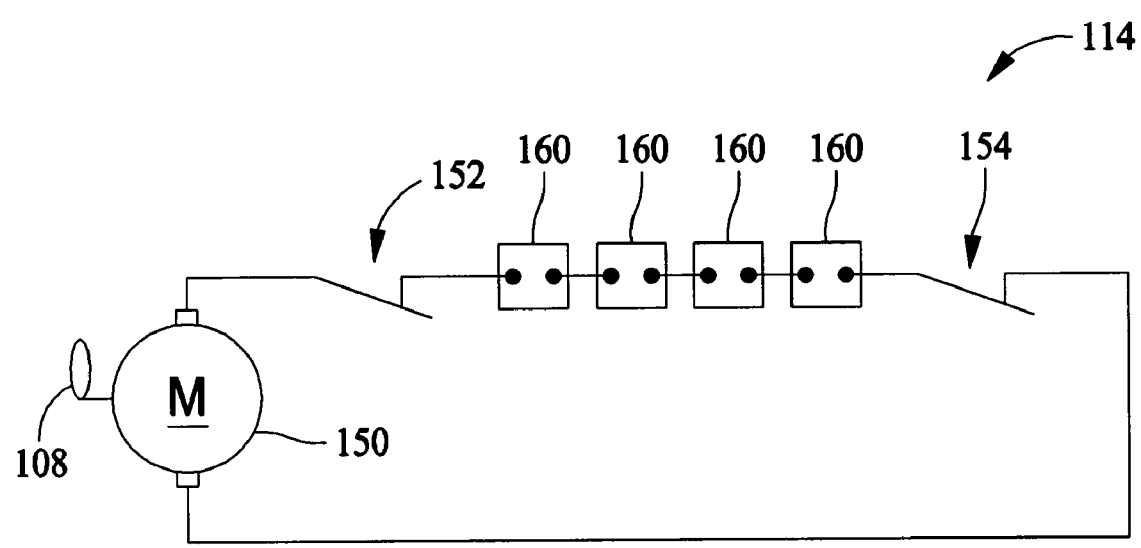
FIG. 3 is a simplified schematic illustration of exemplary variable blade pitch drive system that can be used with the wind turbine shown in FIG. 1.

FIG. 3 is a simplified schematic illustration of exemplary variable blade pitch drive system 114. In the exemplary embodiment, variable blade pitch drive 114 includes a drive motor 150 that can be utilized to adjust the pitch of at least one of turbine blades 108 (shown in FIG. 1). Variable blade pitch drive system 114 also includes a limit switch 152, which switches off drive motor 150 when a ninety-degree blade angle is attained, a switching relay 154 which closes the drive current circuit in case of a system power failure and/or to initiate a system safety shutdown, and a plurality of batteries 160. In the exemplary embodiment, batteries 160 are wired together in series to provide a power output that is approximately equivalent to output of each individual battery combined together. Accordingly drive motor 150 is continuously supplied with driving energy from batteries 160 on closure of switching relay 154 to enable variable blade pitch drive system 114 to reposition blades 108 in the event of either a power failure and/or an initiation of the safety shutdown.

Figure 4:
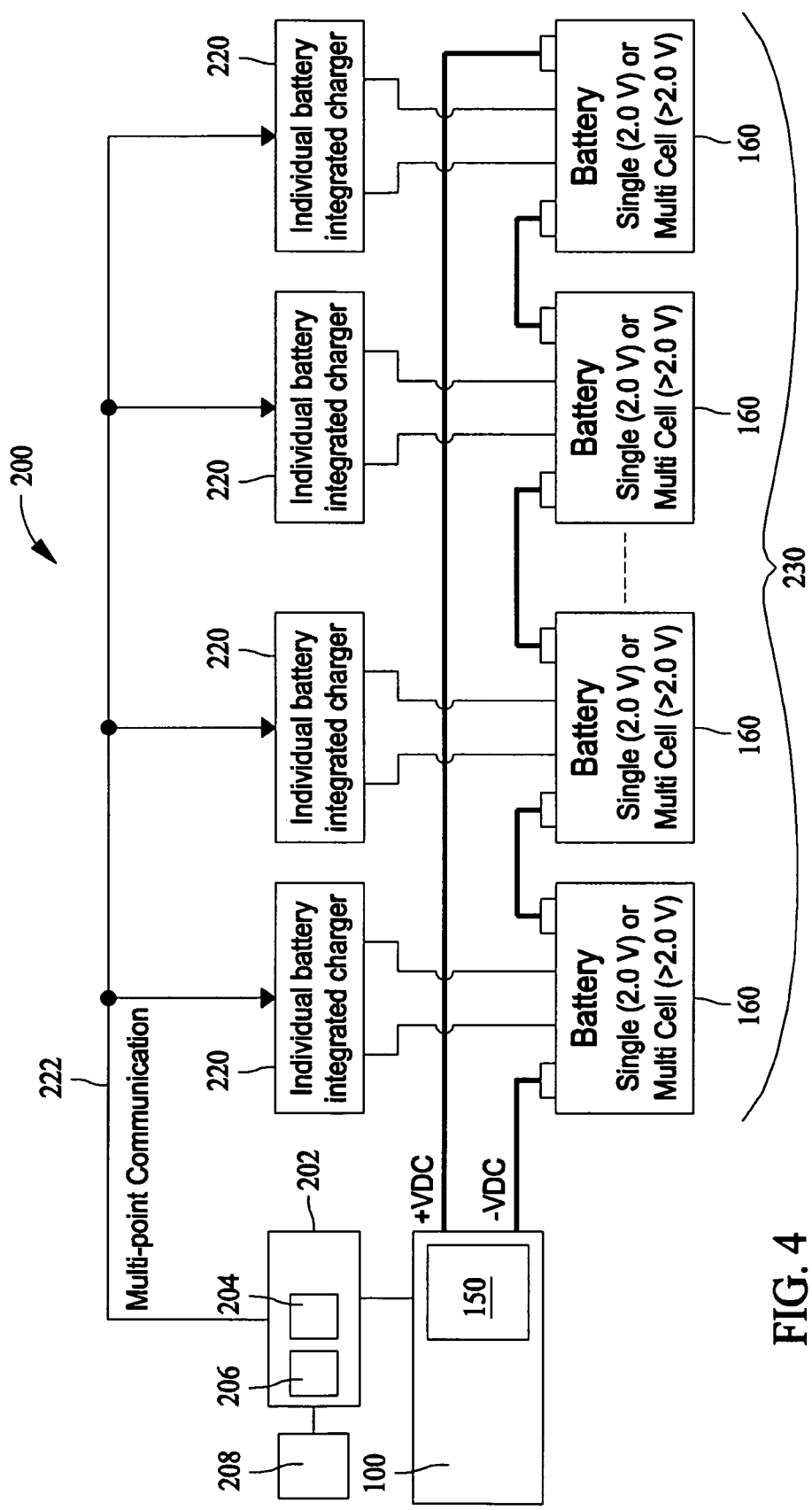
FIG. 4 is a simplified schematic illustration of an exemplary charging system that can be utilized to charge a plurality of batteries such as the batteries shown in FIG. 3.

FIG. 4 is a simplified schematic illustration of an exemplary charging system 200 that can be utilized to charge a plurality of batteries such as, batteries 160 shown in FIG. 3. In the exemplary embodiment, charging system 200 is coupled to a customer system. For example, and in the exemplary embodiment, the customer system is wind turbine 100 including drive motor 150 that is coupled to batteries 160. In the exemplary embodiment, the customer system includes at least a computer 202 that includes a microprocessor 204 and a memory 206. As used herein, microprocessor 204 refers to controllers and processors, including microcontrollers, programmable logic controllers, input/output controllers, reduced instruction set circuits, application specific integrated circuits, logic circuits, and any other circuit, processor or microcomputer capable of processing the embodiments described herein. Memory 206 can be either internal or external to microprocessor 204. In the exemplary embodiment, the customer system also includes a monitor 208 that is coupled to computer 202. In the exemplary embodiment, computer 202 is coupled externally to wind turbine 100 and configured to monitor information received from a plurality of wind turbines 100, i.e. a wind turbine farm. In an alternative embodiment, computer 202 is coupled within wind turbine 100.

In the exemplary embodiment, charging system 200 includes a plurality of battery charger assemblies 220 that are each coupled to a network communication link 222. More specifically, battery charger assemblies 220 are coupled to computer 202 utilizing communication link 222. In the exemplary embodiment, battery charger assemblies 220 are coupled to computer 202 utilizing any of several known formats including a hard wired interface, such as an RS-232 serial interface, or alternatively can be infrared (optical), for example using the television remote standard of a 40 kilohertz carrier or other standard. Alternatively a radio frequency interface can be used, a Local Area Network (LAN), and/or the internet. Moreover, each battery charger assembly 220 is coupled to a respective battery 160 to facilitate charging the respective batteries 160. In the exemplary embodiment, batteries 160 are coupled together in series to form a string of batteries 230 that includes n batteries 160 wherein n≧2, and a respective battery charger is coupled to each individual battery 160. More specifically, charging system 200 includes n batteries 160 and n battery charger assemblies 220 such that each battery 160 is coupled to a dedicated battery charger assembly 220. In the exemplary embodiment, string of batteries 230 is a series string of batteries, i.e. batteries 160 are electrically coupled in a series arrangement. In another embodiment, string of batteries 230 is a parallel string of batteries, i.e. batteries 160 are electrically coupled in a parallel arrangement.

Figure 5:
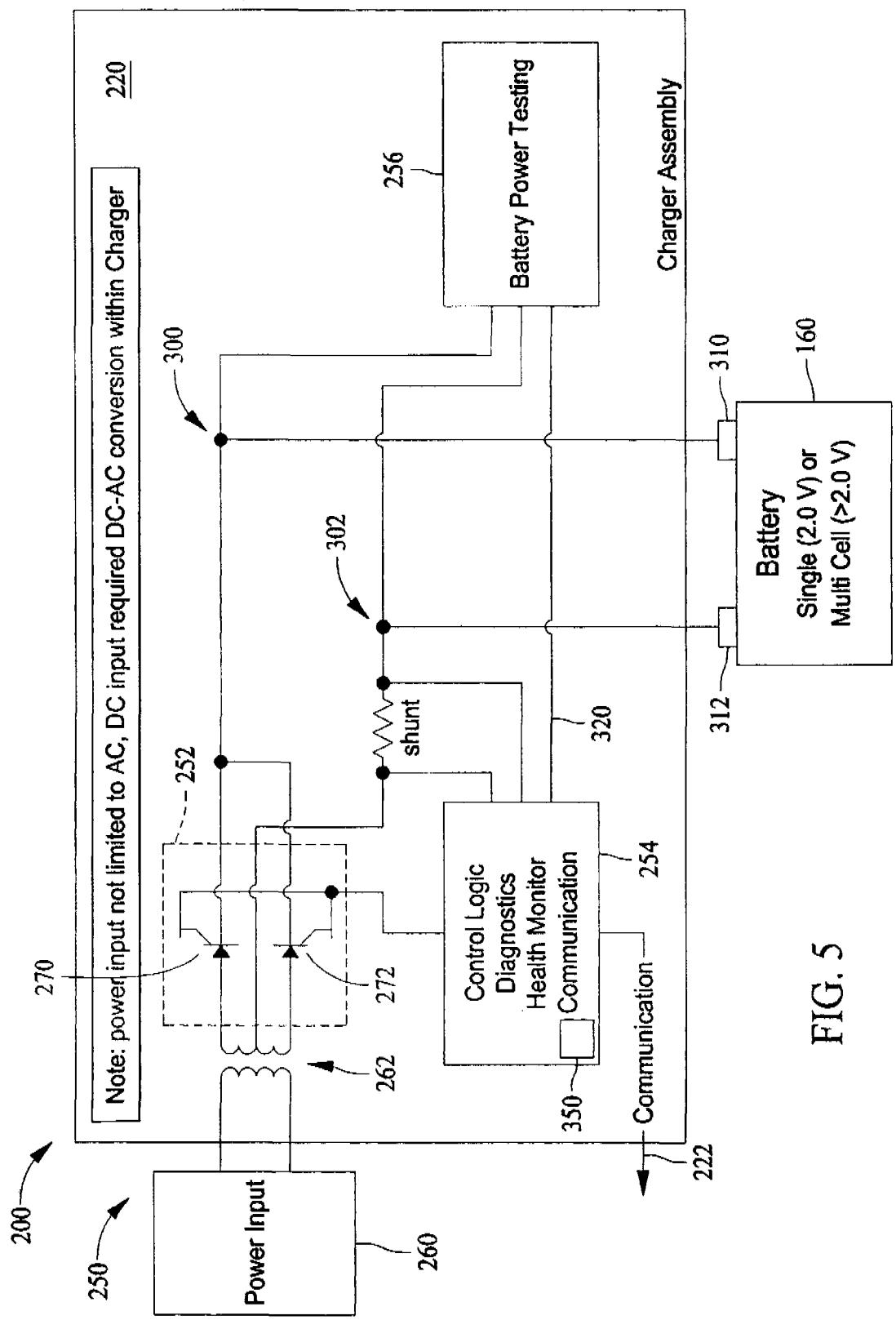
FIG. 5 is a detailed schematic illustration of a portion of the charging system shown in FIG. 4.

FIG. 5 is a detailed schematic illustration of a portion of charging system 200 shown in FIG. 4. In the exemplary embodiment, each battery charger assembly 220 includes an input power transformation stage 250, an alternating current (AC) rectification stage 252, a power output measurement stage 254, and a battery testing stage 256.

In the exemplary embodiment, input power transformation stage 250 includes a power input 260 and a transformer 262 that is electrically coupled to power input 260. In one embodiment, transformer 262 is an AC-AC transformer such that an alternating current input into transformer 262 is also output as an alternating current. In one embodiment, transformer 262 is either a step-up transformer, a step-down transformer, or an isolation transformer. In another embodiment, transformer 262 is an AC-DC transformer that outputs a direct current signal.

In the exemplary embodiment, transformer 262 is coupled to rectification stage 252. Rectification stage 252 includes at least two silicon controlled rectifiers 270 and 272 that are each coupled to a respective output of transformer 262, and are configured to supply an electrical current to battery 160 to facilitate charging battery 160. Moreover, power for section 254 is generated and/or derived separate from section 272, and is not shown in FIG. 5. Additionally, control section 254 is powered by a separate diode rectifier/Capacitive filter and Regulator circuit that is on independent transformer windings. This topology is used to provide uninterrupted power to the logic during fault conditions on the power section.

In the exemplary embodiment, battery testing stage 256 is also configured to receive an electrical current from rectification stage 252. More specifically, battery testing stage 256 is coupled to a first node 300 such that battery testing stage 256 is electrically coupled to rectification stage 252 and is therefore powered by rectification stage 252. Additionally, battery testing stage 256 is electrically coupled to a second node 302 which is coupled to the neutral path of transformer 262 and therefore functions as the ground and/or neutral for battery charger assembly 220. More specifically, each battery 160 includes a cathode 310 that is electrically coupled to node 300 and thus electrically coupled in parallel with battery testing stage 256 and rectification stage 252 such that rectification stage 252 supplies an electrical current to both battery testing stage 256 and battery cathode 310. Each battery 160 also includes an anode 312 that is electrically coupled to node 302 and thus electrically coupled in parallel with battery testing stage 256 and rectification stage 252 such that rectification stage 252 functions as a neutral and/or ground for both battery testing stage 256 and battery anode 312.

In the exemplary embodiment, battery testing stage 256 is configured to determine whether battery 160 is operating within predetermined limits, receiving a predetermined charging current, and/or is maintaining a predetermined charge. For example, in one embodiment, battery testing stage 256 is configured to place a predetermined load across cathode 310 and anode 312 for a predetermined amount of time and then measure the voltage across cathode 310 and anode 312 to determine whether battery 160 is maintaining a predetermined voltage. More specifically, battery testing stage 256 may include a voltage measurement circuit and/or a current measurement circuit to monitor the state of battery 160 during charge cycles and use. The results of the battery test are then transmitted from battery testing stage 256 to power output measurement stage 254 via a communications link 320 and then to computer 202 via communications link 222.

In the exemplary embodiment, power output measurement stage 254 is configured to provide the logic control to operate SCR's 270 and 272 and thus charge battery 160, to perform diagnostics and monitor the health of battery 160, and to communicate information from battery charger assembly 220 to computer 202 and thus to a system operator.

More specifically, power output measurement stage 254 includes a battery charging algorithm to be executed by a microprocessor 350 within power output measurement stage 254. More specifically, to facilitate charging battery 160, the algorithm transmits an electrical signal to SCR's 270 and 272 to open and/or energize SCR's 270 and 272 such that a charging current is transmitted from power input 260 to battery 160. For example, the algorithm for charging of battery 160 may include a three stage charging cycle including a constant current cycle followed by a constant voltage cycle followed by a constant current cycle described in more details as follows: a constant current is applied to the battery being charged until the battery voltage reaches a specified voltage threshold stored as part of the charging algorithm stored microprocessor 350. At that point the battery charger becomes a constant voltage source charger until the current being absorbed by the battery decreases to a current threshold value, also stored as part of the charging algorithm. Then a constant current charge, at a different current level then the first current charging cycle, is applied to the battery or batteries until the change in voltage of the battery over a predetermined time approaches a predetermined threshold (dv/dt), at which time the charger shuts off. In one embodiment, the constant current charge of the third stage runs until the change in battery voltage (dv/dt) is less than 0.1 volt per cell per hour, at which time the charger shuts off. The above described charging algorithm compensates for older batteries or the temperatures at which charging is taking place.

Moreover, and in the exemplary embodiment, power output measurement stage 254 is configured to monitor battery voltage when the battery is not in a charge cycle. The signal across the shunt resistor is utilized for control purposes (Charging current, connection status, etc.)

For example, when power output measurement stage 254 detects that battery voltage has dropped below a preprogrammed threshold, the charging cycle will automatically be restarted. Automatic recharging extends battery life as batteries should not be stored in a partially discharged state. Other embodiments of power output measurement stage 254 include inhibition of use during a charge cycle, maintaining a running total of ampere-hours used, and a running total of a number of times a battery voltage has dipped below a preprogrammed voltage. Inhibition of use during charging cycles is accomplished by feeding the signal signifying that an active charging cycle is taking place back into the microprocessor.

Moreover, and in the exemplary embodiment, power output measurement stage 254 is configured to transmit information generated or observed within battery voltage battery charger assembly 220 to an external user via communications link 222. For example, information to be communicated across communications link 222 could include, but is not limited to, battery charging voltage, battery charging current, battery charger temperature, total ampere-hours used, a number of times a battery voltage has dropped below a particular voltage threshold, initial battery charge state, error diagnostic messages, battery charge time, and other user specified messages.

The battery charging system described herein includes a plurality of individual chargers, wherein each charger is electrically coupled in parallel with only a single battery. More specifically, each individual battery in a multiple battery string (series or parallel configuration) will each receive a dedicated charger with integrated testing and diagnostics capabilities. The chargers can be combined with the battery into an assembly to facilitate eliminating the need for a large (volume, mass) bulk transformer. The exemplary battery charger includes an input power transformation stage (AC-AC or DC-AC), and active AC rectification stage, Power output measurement stage, Battery monitoring stage, and a battery testing stage. During operation, each battery charger includes an algorithm that is fully customizable such that the battery is charged according to programmable charging profile.

As such, the battery charging system described herein eliminates the need for external charge balancing circuitry. Moreover, the balance of charge is achieved thru the independent control of charge for each battery since the individual chargers are capable of more advanced charging profiles customized to specific battery requirements, and also provide capability of testing and diagnostics.

Although the charging system described herein is drawn with respect to a wind turbine, it should be realized that the charging system described herein can be utilized to charge the batteries in a wide variety of systems such as, but not limited to, electric vehicles, gas powered vehicles, automobiles, trains, and electrical generation facilities.

While the invention has been described in terms of various specific embodiments, those skilled in the art will recognize that the invention can be practiced with modification within the spirit and scope of the claims.

What is claimed is:

1. A method for charging a plurality of batteries wherein each battery includes an anode and a cathode, said method comprising:
   electrically coupling n batteries to form a string of batteries, the n batteries including at least a first battery and a second battery;
   electrically coupling n battery charger assemblies to the n batteries such that each respective battery charger assembly is coupled to an anode and a cathode of a single respective battery, the n battery charger assemblies including at least a first battery charger assembly coupled to the first battery and a second battery charger assembly coupled to the second battery;
   charging the n batteries utilizing the n battery charger assemblies;
   placing a first predetermined load across the first battery using the first battery charger assembly;
   placing a second predetermined load across the second battery using the second battery charger assembly;
   determining at the first battery charger assembly whether the first battery is operating within predetermined limits based on the first predetermined load; and
   determining at the second battery charger assembly whether the second battery is operating within the predetermined limits based on the second predetermined load.

2. A method in accordance with claim 1 wherein electrically coupling n batteries to form a string of batteries further comprises electrically coupling n batteries in series to form a series string of batteries.

3. A method in accordance with claim 1 wherein each battery charger assembly includes a customizable battery charging profile, said method further comprising charging each battery of the n batteries using a respective charging profile.

4. A method in accordance with claim 1 wherein each battery charger assembly includes a microprocessor and a battery charging profile stored within the microprocessor, the method further includes operating the first and second battery charger assemblies based on the stored battery charging profiles to charge the respective first and second batteries.

5. A method in accordance with claim 1 wherein each battery charging assembly includes a power input stage and a power rectification stage including a first silicon controlled rectifier and a second silicon controlled rectifier that are each electrically coupled to the power input stage, said method further comprising operating the first and second silicon controlled rectifiers to channel electrical current from the power input stage to a respective battery of the n batteries.

6. A method in accordance with claim 1 wherein each battery charging assembly includes a battery testing stage, said method further comprising operating the battery testing stages to determine whether each respective battery is maintaining a predetermined voltage.

7. A battery charging system comprising:
   a first battery charger assembly coupled in parallel with a first battery, the first battery charger comprising a first battery testing stage configured to monitor measurements of the first battery and to determine whether the first battery is operating within predetermined limits based on the measurements of the first battery; and
   a second battery charger assembly coupled in parallel with a second battery, the second battery charger comprising a second battery testing stage configured to monitor measurements of the second battery and to determine whether the second battery is operating within the predetermined limits based on the measurements of the second battery, the first and second batteries electrically coupled to form a string of batteries.

8. A battery charging system in accordance with claim 7 further comprising n≧3 battery charger assemblies that are each electrically coupled in parallel to a respective battery.

9. A battery charger system in accordance with claim 7 wherein the first and second batteries are coupled in series to form a series string of batteries.

10. A battery charging system in accordance with claim 7 wherein said first and second battery charger assemblies each comprise:
    a microprocessor; and
    a battery charging profile stored within the microprocessor, said first and second battery charger assemblies configured to charge the first and second batteries according to the respective battery charging profile.

11. A battery charging system in accordance with claim 7 wherein said first and second battery charger assemblies each comprise:
    a power input stage;
    a power rectification stage comprising a first silicon controlled rectifier and a second silicon controlled rectifier that are each electrically coupled to said power input stage.

12. A battery charging system in accordance with claim 11 wherein said first and second battery charger assemblies each further comprise a power output measurement stage electrically coupled to said first and second silicon controlled rectifiers and configured to operate said first and second silicon controlled rectifiers to channel electrical current from said power input stage to the first and second batteries.

13. A battery charger system in accordance with claim 7 wherein said first battery testing stage and said second battery testing stage are each configured to at least one of receive a predetermined charging current and maintain a predetermined charge.

14. A battery charger system in accordance with claim 7 further comprising a communication link coupled between said first and second battery charger assemblies and an external user to facilitate transmitting data from said first and second battery charger assemblies to the external user.

15. A wind turbine comprising:
    a rotor having at least one blade operatively coupled to at least one pitch motor; and
    a battery charging system comprising:
        a first battery charger assembly coupled in parallel with a first battery, the first battery charger assembly configured to determine whether the first battery is operating within predetermined limits based on measurements of the first battery; and
        a second battery charger assembly coupled in parallel with a second battery, the second battery charger assembly configured to determine whether the second battery is operating within the predetermined limits based on measurements of the second battery, the first and second batteries electrically coupled to form a string of batteries that is coupled to the at least one pitch motor.

16. A wind turbine in accordance with claim 15 wherein said battery charging system further comprises n≧3 battery charger assemblies that are each electrically coupled in parallel to a respective battery.

17. A wind turbine in accordance with claim 15 wherein the first and second batteries are coupled in series to form a series string of batteries.

18. A wind turbine in accordance with claim 15 wherein said first and second battery charger assemblies each comprise:
    a microprocessor; and
    a battery charging profile stored within the microprocessor, said first and second battery charger assemblies configured to charge the first and second batteries according to the respective battery charging profile.

19. A wind turbine in accordance with claim 15 wherein said first and second battery charger assemblies each comprise:
    a power input stage;
    a power rectification stage comprising a first silicon controlled rectifier and a second silicon controlled rectifier that are each electrically coupled to said power input stage;
    a power output measurement stage electrically coupled to said first and second silicon controlled rectifiers and configured to operate said first and second silicon controlled rectifiers to channel electrical current from said power input stage to a respective battery of the first and second batteries; and
    a battery testing stage to determine whether each of the first and second batteries is operating within the predetermined limits.

20. A wind turbine in accordance with claim 15 further comprising a communication link coupled between said first and second battery charger assemblies and an external user to facilitate transmitting data from said first and second battery charger assemblies to the external user.

* * * * *